US 10,573,735 B2

(12) United States Patent
Koyama et al.

(10) Patent No.: US 10,573,735 B2
(45) Date of Patent: Feb. 25, 2020

(54) SEMICONDUCTOR DEVICE

(71) Applicant: Kabushiki Kaisha Toshiba, Minato-ku (JP)

(72) Inventors: Masahiro Koyama, Kawasaki (JP); Tatsuo Shimizu, Shinagawa (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/690,448

(22) Filed: Aug. 30, 2017

(65) Prior Publication Data
US 2018/0212046 A1 Jul. 26, 2018

(30) Foreign Application Priority Data

Jan. 26, 2017 (JP) .................................. 2017-011987

(51) Int. Cl.
*H01L 29/08* (2006.01)
*H01L 29/45* (2006.01)
(Continued)

(52) U.S. Cl.
CPC ...... *H01L 29/7783* (2013.01); *H01L 29/0684* (2013.01); *H01L 29/1054* (2013.01);
(Continued)

(58) Field of Classification Search
CPC ............. H01L 29/7783; H01L 29/7787; H01L 29/41766; H01L 29/205; H01L 29/4236;
(Continued)

(56) References Cited

U.S. PATENT DOCUMENTS 6,849,512 B1 * 2/2005 Lo ..................... H01L 21/26506
  438/287
8,912,571 B2 * 12/2014 Kanamura ........ H01L 29/66462
  257/194
(Continued)

FOREIGN PATENT DOCUMENTS

JP 2005-328059 11/2005
JP 2005-347527 12/2005
(Continued)

OTHER PUBLICATIONS

J.C.Gerbedoen, "AlGaN/GaN MISHEMT with hBN as gate dielectric" (2009), ScienceDirect, Diamond & Related Materials 18, 1039-1042 (Year: 2009).*
(Continued)

*Primary Examiner* — Mary A Wilczewski
*Assistant Examiner* — Tsz K Chiu
(74) *Attorney, Agent, or Firm* — Oblon, McClelland, Maier & Neustadt, L.L.P.

(57) ABSTRACT

According to one embodiment, a semiconductor device includes a first electrode, a second electrode, a third electrode, a first semiconductor region, a second semiconductor region, a third semiconductor region, and an intermediate region. A position of the first electrode is between a position of the second electrode and a position of the third electrode. The first semiconductor region is separated from the first, second, and third electrodes. The second semiconductor region is provided between the second electrode and the first semiconductor region. The third semiconductor region is provided between the third electrode and the first semiconductor region. The intermediate region includes at least one of a first compound or a second compound. At least a portion of the first electrode is positioned between the second and third semiconductor regions. The intermediate region
(Continued)

includes a first partial region, a second partial region, and a third partial region.

17 Claims, 2 Drawing Sheets

(51) Int. Cl.
    *H01L 29/10*     (2006.01)
    *H01L 29/20*     (2006.01)
    *H01L 29/732*     (2006.01)
    *H01L 29/778*     (2006.01)
    *H01L 29/205*     (2006.01)
    *H01L 29/417*     (2006.01)
    *H01L 29/423*     (2006.01)
    *H01L 29/06*     (2006.01)

(52) U.S. Cl.
    CPC ...... *H01L 29/205* (2013.01); *H01L 29/41758* (2013.01); *H01L 29/42316* (2013.01); *H01L 29/2003* (2013.01)

(58) Field of Classification Search
    CPC . H01L 29/2003; H01L 29/207; H01L 29/778; H01L 29/812
    See application file for complete search history.

(56) References Cited

U.S. PATENT DOCUMENTS

| | | | | |
|---|---|---|---|---|
| 8,987,780 | B2* | 3/2015 | Zhang | H01L 29/66431 |
| | | | | 257/12 |
| 9,755,040 | B2* | 9/2017 | Aoki | H01L 29/512 |
| 10,084,052 | B2* | 9/2018 | Tsuchiya | H01L 29/78 |
| 2003/0224575 | A1* | 12/2003 | Hinoue | H01L 21/823462 |
| | | | | 438/275 |
| 2005/0258491 | A1 | 11/2005 | Bojarczuk, Jr. et al. | |
| 2006/0194379 | A1 | 8/2006 | Suda et al. | |
| 2006/0194451 | A1* | 8/2006 | Lee | H01L 21/28185 |
| | | | | 438/786 |
| 2007/0090471 | A1 | 4/2007 | Cartier et al. | |
| 2008/0093626 | A1* | 4/2008 | Kuraguchi | H01L 29/003 |
| | | | | 257/190 |
| 2009/0325339 | A1 | 12/2009 | Niiyama et al. | |
| 2012/0138944 | A1* | 6/2012 | Kanamura | H01L 29/513 |
| | | | | 257/66 |
| 2013/0069175 | A1* | 3/2013 | Ozaki | H01L 23/3171 |
| | | | | 257/411 |
| 2017/0141218 | A1* | 5/2017 | Iucolano | H01L 21/0254 |

FOREIGN PATENT DOCUMENTS

| | | |
|---|---|---|
| JP | 2009-514218 | 4/2009 |
| JP | 2009-246033 | 10/2009 |
| JP | 4526484 | 8/2010 |
| JP | 2012-119638 | 6/2012 |
| JP | 2013-140835 | 7/2013 |

OTHER PUBLICATIONS

J.-C, Gerbedoen, AlGaN/GaN MISHEMT with hBN as gate dielectric, Feb. 24, 2009, Diamond&related materials, 18, pp. 1039-1042 (Year: 2009).*

Bjorn Marlid, et al., "Atomic layer deposition of BN thin films," 2002, Thin Solid Films, vol. 402, pp. 167-171.

M. Chubarov, et al., "Chemical vapour deposition of epitaxial rhombohedral BN thin films on SiC substrates," 2014, Cryst. Eng. Comm., vol. 16, pp. 5430-5436.

Kazuaki Kobayashi, et al. "First-Principles Study of AlBN and Related Polytypes," 2013, Trans. Mat. Res. Soc. Japan, vol. 38, pp. 485-492.

* cited by examiner

SEMICONDUCTOR DEVICE

CROSS-REFERENCE TO RELATED APPLICATIONS

This application is based upon and claims the benefit of priority from Japanese Patent Application No. 2017-011987, filed on Jan. 26, 2017; the entire contents of which are incorporated herein by reference.

FIELD

Embodiments described herein relate generally to a semiconductor device.

BACKGROUND

Stable characteristics of a semiconductor device are desirable.

DETAILED DESCRIPTION

Figure 1:
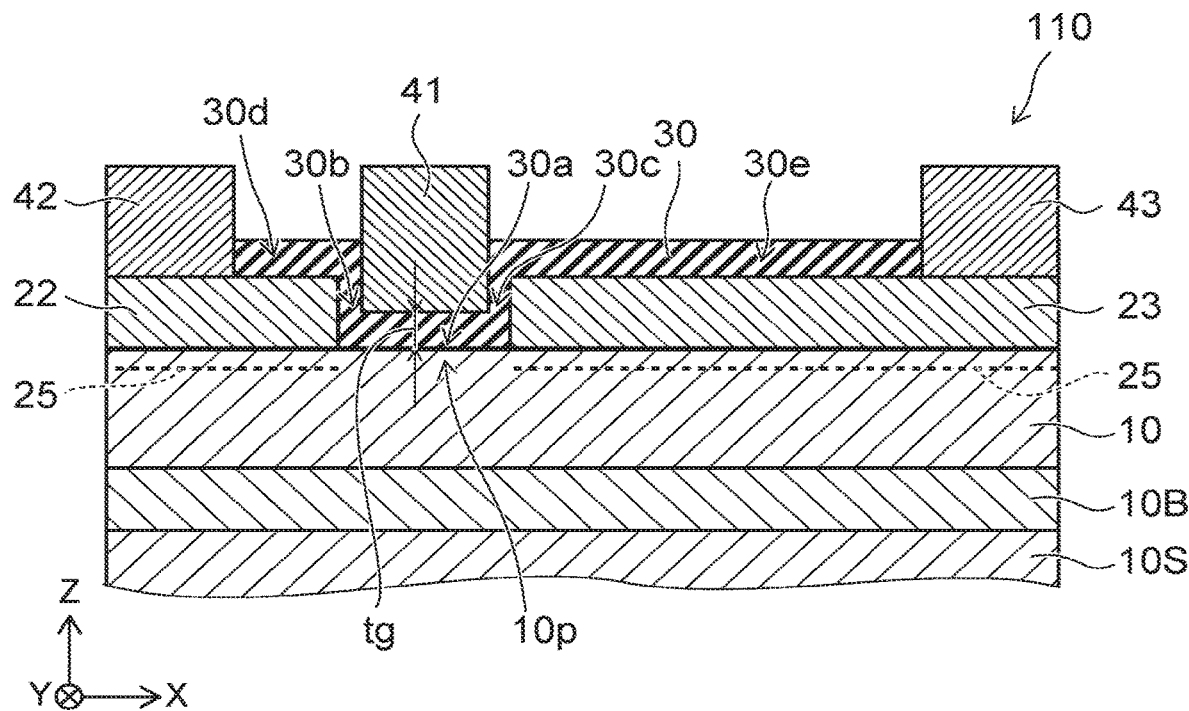
FIG. 1 is a schematic cross-sectional view illustrating a semiconductor device according to a first embodiment.

According to one embodiment, a semiconductor device includes a first electrode, a second electrode, a third electrode, a first semiconductor region, a second semiconductor region, a third semiconductor region, and an intermediate region. A position of the first electrode in a first direction is between a position of the second electrode in the first direction and a position of the third electrode in the first direction. The first direction is from the second electrode toward the third electrode. The first semiconductor region includes $Al_{x1}Ga_{1-x1}N$ ($0 \le x1 < 1$) and is separated from the first electrode, the second electrode, and the third electrode in a second direction crossing the first direction. The second semiconductor region includes $Al_{x2}Ga_{1-x2}N$ ($x1 \le x2 < 1$) and is provided between the second electrode and the first semiconductor region in the second direction. The third semiconductor region includes $Al_{x3}Ga_{1-x3}N$ ($x1 \le x3 < 1$) and is provided between the third electrode and the first semiconductor region in the second direction. The intermediate region includes at least one of a first compound or a second compound. The first compound includes $Al_{x4}Ga_{1-x4}N$ ($x2 \le x4 \le 1$ and $x3 \le x4 \le 1$). The second compound includes boron and nitrogen. At least a portion of the first electrode is positioned between the second semiconductor region and the third semiconductor region in the first direction. The intermediate region includes a first partial region positioned between the first electrode and the first semiconductor region in the second direction, a second partial region positioned between the second semiconductor region and the at least a portion of the first electrode in the first direction, and a third partial region positioned between the third semiconductor region and the at least a portion of the first electrode in the first direction.

According to another embodiment, a semiconductor device includes a first electrode, a second electrode, a third electrode, a first semiconductor region, a second semiconductor region, a third semiconductor region, and an intermediate region. A position of the first electrode in a first direction is between a position of the second electrode in the first direction and a position of the third electrode in the first direction. The first direction is from the second electrode toward the third electrode. The first semiconductor region includes a first nitride semiconductor and is separated from the first electrode, the second electrode, and the third electrode in a second direction crossing the first direction. The second semiconductor region includes a second nitride semiconductor and is provided between the second electrode and the first semiconductor region in the second direction. The third semiconductor region includes a third nitride semiconductor and is provided between the third electrode and the first semiconductor region in the second direction. The intermediate region includes at least one of a first compound or a second compound. A second bandgap energy of the second semiconductor region is larger than a first bandgap energy of the first semiconductor region. A third bandgap energy of the third semiconductor region is larger than the first bandgap energy. A bandgap energy of the first compound is larger than the second bandgap energy and larger than the third bandgap energy. The second compound includes boron and nitrogen. At least a portion of the first electrode is positioned between the second semiconductor region and the third semiconductor region in the first direction. The intermediate region includes a first partial region positioned between the first electrode and the first semiconductor region in the second direction, a second partial region positioned between the second semiconductor region and the at least a portion of the first electrode in the first direction, and a third partial region positioned between the third semiconductor region and the at least a portion of the first electrode in the first direction.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating a semiconductor device according to a first embodiment.

The semiconductor device 110 according to the embodiment includes a first electrode 41, a second electrode 42, a third electrode 43, a first semiconductor region 10, a second semiconductor region 22, a third semiconductor region 23, and an intermediate region 30.

A direction from the second electrode 42 toward the third electrode 43 is taken as a first direction.

The first direction is taken as an X-axis direction. One direction perpendicular to the X-axis direction is taken as a Z-axis direction. A direction perpendicular to the X-axis direction and the Z-axis direction is taken as a Y-axis direction.

The position of the first electrode 41 in the first direction (the X-axis direction) is between the position of the second electrode 42 in the first direction and the position of the third electrode 43 in the first direction. At least a portion of the second electrode 42, at least a portion of the first electrode 41, and at least a portion of the third electrode 43 are arranged in this order along the X-axis direction.

The first electrode 41 is, for example, a gate electrode. The second electrode 42 is, for example, a source electrode. The third electrode 43 is, for example, a drain electrode.

The first semiconductor region 10 is separated from the first electrode 41, the second electrode 42, and the third electrode 43 in a second direction. The second direction crosses the first direction. The second direction is, for example, the Z-axis direction. The first semiconductor region 10 includes $Al_{x1}Ga_{1-x1}N$ ($0 \leq x1 < 1$).

The second semiconductor region 22 is provided between the second electrode 42 and the first semiconductor region 10 in the second direction (e.g., the Z-axis direction). The second semiconductor region 22 includes $Al_{x2}Ga_{1-x2}N$ ($x1 \leq x2 < 1$).

The third semiconductor region 23 is provided between the third electrode 43 and the first semiconductor region 10 in the second direction (e.g., the Z-axis direction). The third semiconductor region 23 includes $Al_{x3}Ga_{1-x3}N$ ($x1 \leq x3 < 1$).

At least a portion of the first electrode 41 is positioned between the second semiconductor region 22 and the third semiconductor region 23 in the first direction (the X-axis direction). The first electrode 41 is, for example, a recessed gate electrode.

The intermediate region 30 includes a first partial region 30a, a second partial region 30b, and a third partial region 30c. In the example, a fourth partial region 30d and a fifth partial region 30e are further provided.

The first partial region 30a is positioned between the first electrode 41 and the first semiconductor region 10 in the second direction (e.g., the Z-axis direction). The second partial region 30b is positioned between the second semiconductor region 22 and the portion of the first electrode 41 recited above in the first direction (the X-axis direction). The third partial region 30b is positioned between the third semiconductor region 23 and the portion of the first electrode 41 recited above in the first direction (the X-axis direction).

At least a portion of the second semiconductor region 22 is positioned between the fourth partial region 30d and the first semiconductor region 10 in the second direction (e.g., the Z-axis direction). At least a portion of the third semiconductor region 23 is positioned between the fifth partial region 30e and the first semiconductor region 10 in the second direction.

The second semiconductor region 22 is electrically connected to the second electrode 42. The third semiconductor region 23 is electrically connected to the third electrode 43.

The intermediate region 30 includes at least one of a first compound or a second compound. The first compound includes $Al_{x4}Ga_{1-x4}N$ ($x2 \leq x4 \leq 1$ and $x3 \leq x4 \leq 1$). The second compound includes boron and nitrogen. For example, at least a portion of the intermediate region 30 may include a microcrystal. For example, the intermediate region 30 may include an amorphous region.

For example, the first semiconductor region 10 includes GaN. The second semiconductor region 22 and the third semiconductor region 23 include AlGaN. The intermediate region 30 includes, for example, at least one of AlN or BN.

Focusing now on the bandgap energies, the bandgap energies are, for example, as follows. The second bandgap energy of the second semiconductor region 22 is larger than the first bandgap energy of the first semiconductor region 10. The third bandgap energy of the third semiconductor region 23 is larger than the first bandgap energy. The bandgap energy of the first compound included in the intermediate region 30 is larger than the second bandgap energy and larger than the third bandgap energy.

Thus, the bandgap energy of the intermediate region 30 is large. Therefore, the intermediate region 30 substantially functions as an insulating film. The intermediate region 30 functions as, for example, a gate insulating film.

For example, the first semiconductor region 10 includes portions overlapping the second semiconductor region 22 and the third semiconductor region 23 in the Z-axis direction. A two-dimensional electron gas 25 (a 2DEG) is generated in these overlapping portions. The two-dimensional electron gas 25 is the carrier of the semiconductor device 110. For example, a normally-off operation is possible in the semiconductor device 110. For example, the semiconductor device 110 is a MIS transistor.

In the embodiment, the intermediate region 30 includes the first compound which is a nitride, and the second compound which is a nitride. Therefore, the chemical properties of the intermediate region 30 are near the chemical properties of the first semiconductor region 10, the second semiconductor region 22, and the third semiconductor region 23. For example, high affinity is obtained.

In the embodiment, the intermediate region 30 substantially does not include oxygen. On the other hand, as a reference example, an oxide such as an aluminum oxide film or the like is used as the gate insulating film. In the reference example, the first semiconductor region 10, the second semiconductor region 22, and the third semiconductor region 23 are oxidized easily at the vicinity of the portions contacting the intermediate region 30. Thereby, there are cases where the desired characteristics are not obtained easily. In the reference example, there are cases where the intermediate region 30 that is the oxide film is nitrided. Thereby, there are cases where the desired characteristics are not obtained easily.

Conversely, in the embodiment, the intermediate region 30 includes the first compound which is the nitride and the second compound which is the nitride. Therefore, the oxidization of the nitride semiconductor region recited above is suppressed. In the embodiment, the nitriding of the gate insulating film that occurs when the oxide gate insulating film is used does not occur.

The bandgap energies of the first compound recited above and the second compound recited above are sufficiently high. Therefore, the leakage current can be suppressed.

In the embodiment, for example, a semiconductor film that is used to form the second semiconductor region 22 and the third semiconductor region 23 is formed on the first semiconductor region 10. A recess portion (e.g., a hole) is formed by removing a portion of the semiconductor film. The intermediate region 30 is formed inside the recess portion and on the upper surface of the semiconductor film. Subsequently, the first electrode 41 is formed by filling a conductive material into the recess portion.

There are cases where the first semiconductor region 10 is damaged at the bottom portion of the hole in the process of removing the portion of the semiconductor film recited above. Further, there are cases where the second semiconductor region 22 and the third semiconductor region 23 are damaged at the side portions of the hole in the process of removing the portion of the semiconductor film recited above. Thereby, there are cases where the fluctuation of the characteristics is large. There are cases where the characteristics are unstable. In particular, the uniformity of the characteristics degrades easily in the case where an oxide is used as the gate insulating film.

On the other hand, in the embodiment, the nitride intermediate region 30 is formed on the first semiconductor region 10 at the bottom portion of the hole. Further, the intermediate region 30 is formed also on the side surfaces of the hole. The intermediate region 30 is formed on the surfaces of the second semiconductor region 22 and the third semiconductor region 23 at the side surfaces of the hole. The chemical properties of the material of the intermediate region 30 that is formed are near the chemical properties of the first semiconductor region 10, the second semiconductor region 22, and the third semiconductor region 23. Therefore, the film properties of the surface portions of the first semiconductor region 10, the second semiconductor region 22, and the third semiconductor region 23 do not degrade. For example, the film properties of the surface portions of the first semiconductor region 10, the second semiconductor region 22, and the third semiconductor region 23 are recovered.

According to the embodiment, a semiconductor device can be provided in which the stability of the characteristics can be improved.

In the embodiment, the intermediate region 30 includes the second compound. In such a case, the intermediate region 30 includes BN. The second compound may further include aluminum in addition to boron and nitrogen. In such a case, the intermediate region 30 includes, for example, $B_{x5}Al_{1-x5}N$ ($0 \leq x5 \leq 1$).

The thickness of the intermediate region 30 is, for example, not less than 1 nanometer (nm) and not more than 100 nm. As shown in FIG. 1, the thickness along the second direction (e.g., the Z-axis direction) of the first partial region 30a is taken as a thickness tg. The thickness tg is, for example, not less than 1 nm and not more than 100 nm. Thereby, for example, the first electrode 41 and the first semiconductor region 10 are electrically insulated from each other. For example, the intermediate region 30 functions as a good gate insulating film.

For example, the intermediate region 30 contacts the first semiconductor region 10. For example, the first semiconductor region 10 includes a portion 10p overlapping the first electrode 41 in the second direction (e.g., the Z-axis direction). The first partial region 30a may physically contact the overlapping portion 10p recited above.

For example, the second partial region 30b may physically contact the second semiconductor region 22. The third partial region 30c may physically contact the third semiconductor region 23. For example, the two-dimensional electron gas 25 (the 2DEG) substantially is not induced in the portion 10p of the first semiconductor region 10 contacting the intermediate region 30. Thereby, for example, a normally-off operation is possible in the semiconductor device 110. For example, the crystal orientation of the first semiconductor region 10 may not be inherited by the intermediate region 30. Thereby, the induction of the two-dimensional electron gas 25 is suppressed. For example, at least a portion of the intermediate region 30 may be amorphous. Thereby, the induction of the two-dimensional electron gas 25 is suppressed.

In the embodiment, the first semiconductor region 10 includes, for example, GaN. In the embodiment, the composition ratio of aluminum included in the first semiconductor region 10 may be, for example, less than 0.01. On the other hand, the composition ratio of aluminum included in the second semiconductor region 22 may be not less than 0.01 and not more than 0.3. The composition ratio of aluminum included in the third semiconductor region 23 may be not less than 0.01 and not more than 0.3.

The composition ratio of aluminum included in the second semiconductor region 22 may be substantially the same as the composition ratio of aluminum included in the third semiconductor region 23. For example, the ratio of the difference between the composition ratio of aluminum included in the second semiconductor region 22 and the composition ratio of aluminum included in the third semiconductor region 23 to the composition ratio of aluminum included in the second semiconductor region 22 is 0.1 or less.

In the embodiment, the thickness along the second direction (e.g., the Z-axis direction) of the second semiconductor region 22 is, for example, not less than 5 nm and not more than 50 nm. The thickness along the second direction (e.g., the Z-axis direction) of the third semiconductor region 23 is, for example, not less than 5 nm and not more than 50 nm. Thereby, for example, the two-dimensional electron gas 25 (the 2DEG) is generated at the portion where the first semiconductor region 10 and the second semiconductor region 22 overlap and the portion where the first semiconductor region 10 and the third semiconductor region 23 overlap.

A substrate 10S and a buffer layer 10B are provided in the example shown in FIG. 1. The buffer layer 10B is provided on the substrate 10S. The first semiconductor region 10 is provided on the buffer layer 10B. The second semiconductor region 22 and the third semiconductor region 23 are provided on the first semiconductor region 10. The intermediate region 30 and the electrodes recited above are provided on these semiconductor regions.

Second Embodiment

Figure 2:
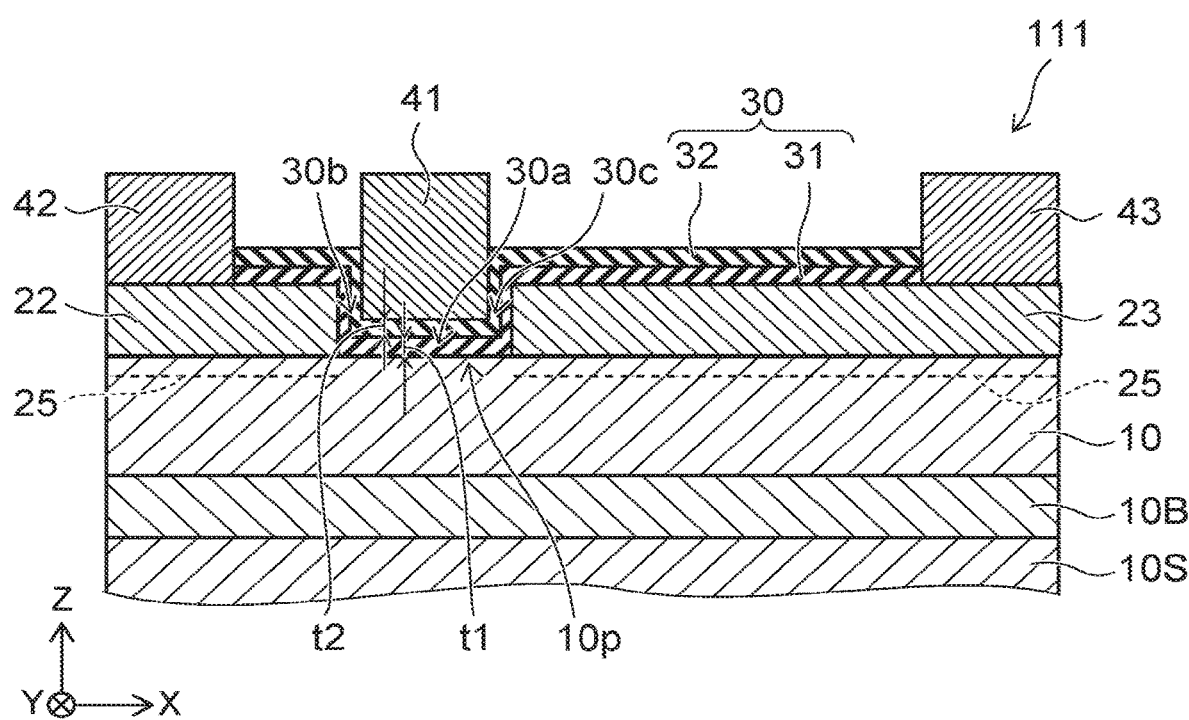
FIG. 2 is a schematic cross-sectional view illustrating a semiconductor device according to a second embodiment.

FIG. 2 is a schematic cross-sectional view illustrating a semiconductor device according to a second embodiment.

The semiconductor device 111 according to the embodiment also includes the first electrode 41, the second electrode 42, the third electrode 43, the first semiconductor region 10, the second semiconductor region 22, the third semiconductor region 23, and the intermediate region 30. In the semiconductor device 111, the intermediate region 30 includes multiple compound regions. These compound regions include nitrides. Otherwise, the configuration of the semiconductor device 111 is similar to the configuration of the semiconductor device 110. The intermediate region 30 of the semiconductor device 111 will now be described.

The intermediate region 30 includes a first compound region 31 and a second compound region 32. The first compound region 31 and the second compound region 32 include nitrides. The first compound region 31 includes the first compound (e.g., AlN, etc.). The second compound region 32 includes the second compound (BN, etc.). These compound regions are stacked.

Such an intermediate region 30 has a large bandgap energy offset with respect to the semiconductor regions (the first semiconductor region 10, the second semiconductor region 22, and the third semiconductor region 23) for both the conduction band and the valence band. For example, high insulative properties are obtained between the first electrode 41 and the first semiconductor region 10. For example, a high threshold voltage is obtained stably. A good normally-off operation is obtained stably. Good characteristics as the gate insulating film are obtained.

In the example shown in FIG. 2, the second compound region 32 is positioned between the first compound region 31 and the first electrode 41. In the embodiment, the first compound region 31 may be positioned between the second compound region 32 and the first electrode 41. In the case where the second compound region 32 is positioned between the first compound region 31 and the first electrode 41, the first compound region 31 that includes Al is near the second semiconductor region 22 and the third semiconductor region 23. The affinity is high between these regions. The chemical properties of these regions are near the chemical properties of the semiconductor regions (the first semiconductor region 10, the second semiconductor region 22, and the third semiconductor region 23). For example, the intermediate region 30 that is more uniform and has higher quality is obtained. For example, a high-quality interface is obtained between the intermediate region 30 and the semiconductor regions (the first semiconductor region 10, the second semiconductor region 22, and the third semiconductor region 23).

In the case where the second compound region 32 (e.g., BN, etc.) is positioned between the first compound region 31 (e.g., AlN, etc.) and the first electrode 41, for example, the first compound region 31 (e.g., AlN, etc.) contacts the first semiconductor region 10 (e.g., GaN). In such a case, the energy level of the conduction band lower end of the first compound region 31 (e.g., AlN, etc.) is higher than the energy level of the conduction band lower end of the first semiconductor region 10 (e.g., GaN). On the other hand, the energy level of the valence band upper end of the second compound region 32 (e.g., BN, etc.) is lower than the energy level of the valence band upper end of the first semiconductor region 10 (e.g., GaN). For example, the intermediate region 30 that includes the first compound region 31 and the second compound region 32 has a large bandgap energy offset with respect to the first semiconductor region 10 for both the conduction band and the valence band. High insulative properties are obtained between the first electrode 41 and the first semiconductor region 10. For example, a high threshold voltage is obtained stably. A good normally-off operation is obtained stably. Good characteristics as the gate insulating film are obtained.

The first semiconductor region 10 includes the portion 10p overlapping the first electrode 41 in the second direction (e.g., the Z-axis direction). For example, the first compound region 31 contacts the overlapping portion 10p recited above. For example, the two-dimensional electron gas 25 (the 2DEG) substantially is not induced at the portion 10p of the first semiconductor region 10 contacting the first compound region 31. For example, in the semiconductor device 111, a normally-off operation is possible. For example, the intermediate region 30 may not inherit the crystal orientation of the first semiconductor region 10. Thereby, the induction of the two-dimensional electron gas 25 is suppressed. For example, at least a portion of the intermediate region 30 may be amorphous. Thereby, the induction of the two-dimensional electron gas 25 is suppressed.

For example, a portion of the first compound region 31 may contact the second semiconductor region 22. Another portion of the first compound region 31 may contact the third semiconductor region 23.

The thickness along the second direction of the first compound region 31 between the first electrode 41 and the first semiconductor region 10 in the second direction is taken as a thickness t1. The thickness t1 is, for example, not less than 1 nm and not more than 100 nm. The thickness along the second direction of the second compound region 32 between the first electrode 41 and the first semiconductor region 10 in the second direction is taken as a thickness t2. The thickness t2 is, for example, not less than 1 nm and not more than 100 nm. For example, the first electrode 41 and the first semiconductor region 10 are electrically insulated from each other. A good gate insulating film is obtained.

Third Embodiment

Figure 3:
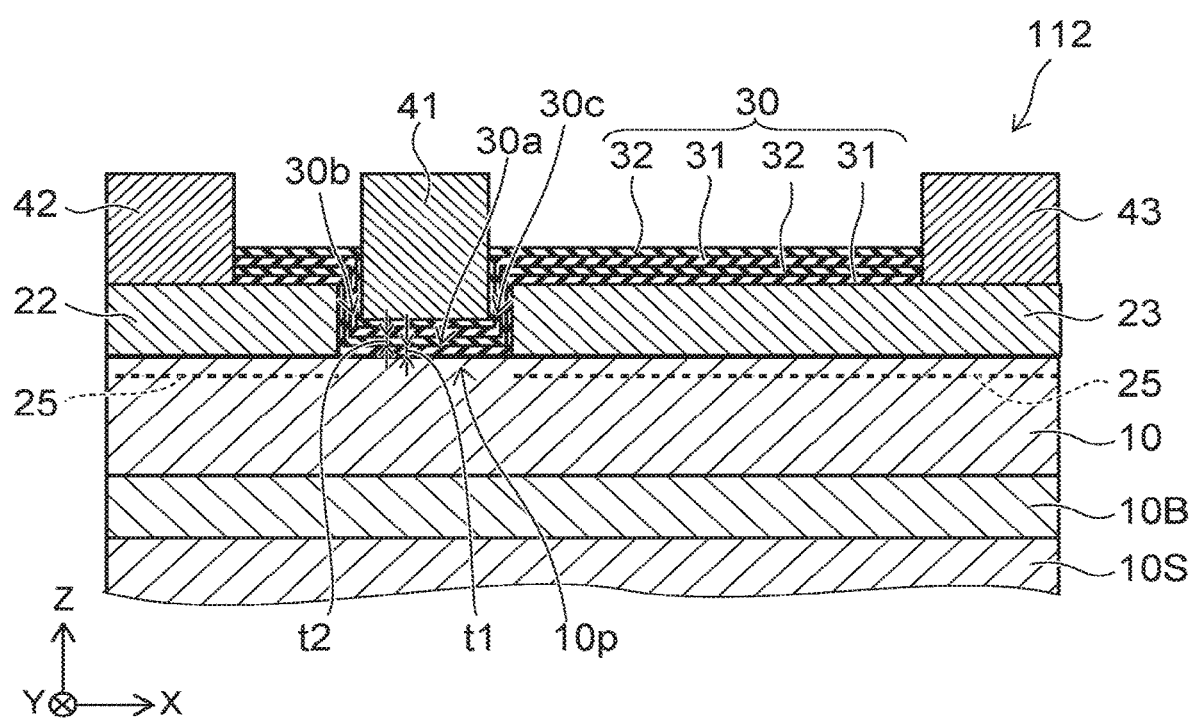
FIG. 3 is a schematic cross-sectional view illustrating a semiconductor device according to a third embodiment.

FIG. 3 is a schematic cross-sectional view illustrating a semiconductor device according to a third embodiment.

The semiconductor device 112 according to the embodiment also includes the first electrode 41, the second electrode 42, the third electrode 43, the first semiconductor region 10, the second semiconductor region 22, the third semiconductor region 23, and the intermediate region 30. The multiple first compound regions 31 and the multiple second compound regions 32 are provided in the intermediate region of the semiconductor device 112. Otherwise, the configuration of the semiconductor device 112 is similar to the configuration of the semiconductor device 111. The intermediate region 30 of the semiconductor device 112 will now be described.

The intermediate region 30 includes the multiple first compound regions 31 including the first compound and the multiple second compound regions 32 including the second compound. The multiple first compound regions 31 and the multiple second compound regions 32 are arranged alternately. For example, the region of the intermediate region 30 positioned on the outermost side is, for example, the first compound region 31. This region may be, for example, the second compound region 32.

In the semiconductor device 112, for example, high insulative properties are obtained between the first electrode 41 and the first semiconductor region 10 by providing the multiple first compound regions 31 and the multiple second compound regions 32 to be arranged alternately. For example, a high threshold voltage is obtained stably. A good normally-off operation is obtained stably. Good characteristics as the gate insulating film are obtained.

In the example shown in FIG. 3, the number of the multiple first compound regions 31 is two; and the number of the multiple second compound regions 32 is two. These numbers may be three or more.

The thickness along the second direction of one of the multiple first compound regions 31 between the first electrode 41 and the first semiconductor region 10 in the second direction (the Z-axis direction) is taken as the thickness t1. The thickness t1 is, for example, not less than 0.5 nm and not more than 10 nm. The thickness along the second direction of one of the multiple second compound regions 32 between the first electrode 41 and the first semiconductor region 10 in the second direction is taken as the thickness t2. The thickness t2 is, for example, not less than 0.5 nm and not more than 10 nm. For example, the first electrode 41 and the first semiconductor region 10 are electrically insulated from each other. A good gate insulating film is obtained.

The embodiments may include the following configurations.

(Configuration 1)

A semiconductor device, comprising:
a first electrode;
a second electrode;
a third electrode, a position of the first electrode in a first direction being between a position of the second electrode in the first direction and a position of the third electrode in the first direction, the first direction being from the second electrode toward the third electrode;
a first semiconductor region including $Al_{x1}Ga_{1-x1}N$ ($0 \leq x1 < 1$) and being separated from the first electrode, the second electrode, and the third electrode in a second direction crossing the first direction;
a second semiconductor region including $Al_{x2}Ga_{1-x2}N$ ($x1 \leq x2 < 1$) and being provided between the second electrode and the first semiconductor region in the second direction;
a third semiconductor region including $Al_{x3}Ga_{1-x3}N$ ($x1 \leq x3 < 1$) and being provided between the third electrode and the first semiconductor region in the second direction; and
an intermediate region including at least one of a first compound or a second compound,
the first compound including $Al_{x4}Ga_{1-x4}N$ ($x2 \leq x4 \leq 1$ and $x3 \leq x4 \leq 1$),
the second compound including boron and nitrogen,
at least a portion of the first electrode being positioned between the second semiconductor region and the third semiconductor region in the first direction,
the intermediate region including
a first partial region positioned between the first electrode and the first semiconductor region in the second direction,
a second partial region positioned between the second semiconductor region and the at least a portion of the first electrode in the first direction, and
a third partial region positioned between the third semiconductor region and the at least a portion of the first electrode in the first direction.

(Configuration 2)
A semiconductor device, comprising:
a first electrode;
a second electrode;
a third electrode, a position of the first electrode in a first direction being between a position of the second electrode in the first direction and a position of the third electrode in the first direction, the first direction being from the second electrode toward the third electrode;
a first semiconductor region including a first nitride semiconductor and being separated from the first electrode, the second electrode, and the third electrode in a second direction crossing the first direction;
a second semiconductor region including a second nitride semiconductor and being provided between the second electrode and the first semiconductor region in the second direction;
a third semiconductor region including a third nitride semiconductor and being provided between the third electrode and the first semiconductor region in the second direction; and
an intermediate region including at least one of a first compound or a second compound,
a second bandgap energy of the second semiconductor region being larger than a first bandgap energy of the first semiconductor region,
a third bandgap energy of the third semiconductor region being larger than the first bandgap energy,
a bandgap energy of the first compound being larger than the second bandgap energy and larger than the third bandgap energy,
the second compound including boron and nitrogen,
at least a portion of the first electrode being positioned between the second semiconductor region and the third semiconductor region in the first direction,
the intermediate region including
a first partial region positioned between the first electrode and the first semiconductor region in the second direction,
a second partial region positioned between the second semiconductor region and the at least a portion of the first electrode in the first direction, and
a third partial region positioned between the third semiconductor region and the at least a portion of the first electrode in the first direction.

(Configuration 3)
The semiconductor device according to configuration 1 or 2, wherein
the intermediate region includes:
a first compound region including the first compound; and
a second compound region including the second compound.

(Configuration 4)
The semiconductor device according to configuration 3, wherein the second compound region is positioned between the first compound region and the first electrode.

(Configuration 5)
The semiconductor device according to configuration 3 or 4, wherein
the first semiconductor region includes a portion overlapping the first electrode in the second direction, and
the first compound region contacts the overlapping portion.

(Configuration 6)
The semiconductor device according to one of configurations 3 to 5, wherein
a portion of the first compound region contacts the second semiconductor region, and
another portion of the first compound region contacts the third semiconductor region.

(Configuration 7)
The semiconductor device according to configurations 3 to 6, wherein
a thickness along the second direction of the first compound region between the first electrode and the first semiconductor region in the second direction is not less than 1 nanometer and not more than 100 nanometers, and
a thickness along the second direction of the second compound region between the first electrode and the first semiconductor region in the second direction is not less than 1 nanometer and not more than 100 nanometers.

(Configuration 8)
The semiconductor device according to configuration 1 or 2, wherein
the intermediate region includes:
a plurality of first compound regions including the first compound; and
a plurality of second compound regions including the second compound, and
the plurality of first compound regions and the plurality of second compound regions are arranged alternately.

(Configuration 9)
The semiconductor device according to configuration 8, wherein
a thickness along the second direction of one of the plurality of first compound regions between the first electrode and the first semiconductor region in the second direction is not less than 0.5 nanometers and not more than 10 nanometers, and
a thickness along the second direction of one of the plurality of second compound regions between the first electrode and the first semiconductor region in the second direction is not less than 0.5 nanometers and not more than 10 nanometers.

(Configuration 10)

The semiconductor device according to configuration 1 or 2, wherein the intermediate region includes the second compound.

(Configuration 11)

The semiconductor device according to configuration 1 or 2, wherein the intermediate region includes the second compound, and the second compound further includes aluminum.

(Configuration 12)

The semiconductor device according to configuration 1 or 2, wherein a thickness along the second direction of the first partial region is not less than 1 nanometer and not more than 100 nanometers.

(Configuration 13)

The semiconductor device according to one of configurations 1 to 12, wherein the intermediate region further includes a fourth partial region and a fifth partial region, at least a portion of the second semiconductor region is positioned between the fourth partial region and the first semiconductor region in the second direction, and at least a portion of the third semiconductor region is positioned between the fifth partial region and the first semiconductor region in the second direction.

(Configuration 14)

The semiconductor device according to one of configurations 1 to 13, wherein the first semiconductor region includes a portion overlapping the first electrode in the second direction, and the first partial region contacts the overlapping portion.

(Configuration 15)

The semiconductor device according to one of configurations 1 to 14, wherein the second partial region contacts the second semiconductor region, and the third partial region contacts the third semiconductor region.

(Configuration 16)

The semiconductor device according to one of configurations 1 to 15, wherein the first semiconductor region includes GaN.

(Configuration 17)

The semiconductor device according to configurations 1 to 15, wherein a composition ratio of aluminum included in the first semiconductor region is less than 0.01.

(Configuration 18)

The semiconductor device according to one of configurations 1 to 17, wherein a composition ratio of aluminum included in the second semiconductor region is not less than 0.01 and not more than 0.3.

(Configuration 19)

The semiconductor device according to one of configurations 1 to 18, wherein a ratio of a difference between a composition ratio of aluminum included in the second semiconductor region and a composition ratio of aluminum included in the third semiconductor region to the composition ratio of aluminum included in the second semiconductor region is 0.1 or less.

(Configuration 20)

The semiconductor device according to configurations 1 to 19, wherein a thickness along the second direction of the second semiconductor region is not less than 5 nanometers and not more than 50 nanometers, and a thickness along the second direction of the third semiconductor region is not less than 5 nanometers and not more than 50 nanometers.

According to the embodiments, a semiconductor device can be provided in which the stability of the characteristics can be improved.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, partial regions, electrodes, buffer layers, substrates, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a first electrode;
    a second electrode;
    a third electrode, a position of the first electrode in a first direction being between a position of the second electrode in the first direction and a position of the third electrode in the first direction, the first direction being from the second electrode toward the third electrode;
    a first semiconductor region including $Al_{x1}Ga_{1-x1}N$ ($0 \leq x1 < 1$) and being separated from the first electrode, the second electrode, and the third electrode in a second direction crossing the first direction;
    a second semiconductor region including $Al_{x2}Ga_{1-x2}N$ ($x1 \leq x2 < 1$) and being provided between the second electrode and the first semiconductor region in the second direction;

a third semiconductor region including $Al_{x3}Ga_{1-x3}N$ (x1≤x3<1) and being provided between the third electrode and the first semiconductor region in the second direction; and an intermediate region, at least a portion of the first electrode being positioned between the second semiconductor region and the third semiconductor region in the first direction, the intermediate region including
- a first partial region positioned between the first electrode and the first semiconductor region in the second direction,
- a second partial region positioned between the second semiconductor region and the at least a portion of the first electrode in the first direction, and
- a third partial region positioned between the third semiconductor region and the at least a portion of the first electrode in the first direction, the first partial region includes a first compound region and a second compound region, the first compound region including a first compound, the first compound including $Al_{x4}Ga_{1-x4}N$ (x2≤x4≤1 and x3≤x4≤1), the second compound region being provided between the first electrode and the first compound region in the second direction, the second compound region including boron and nitrogen, the second partial region includes a third compound region and a fourth compound region, the third compound region including the first compound, the fourth compound region being provided between the second semiconductor region and the at least the portion of the first electrode in the first direction, the fourth compound region including boron and nitrogen, the third partial region includes a fifth compound region and a sixth compound region, the fifth compound region including the first compound, the sixth compound region being provided between the third semiconductor region and the at least the portion of the first electrode in the first direction, the sixth compound region including boron and nitrogen.

2. A semiconductor device, comprising:
a first electrode;
a second electrode;
a third electrode, a position of the first electrode in a first direction being between a position of the second electrode in the first direction and a position of the third electrode in the first direction, the first direction being from the second electrode toward the third electrode;
a first semiconductor region including a first nitride semiconductor and being separated from the first electrode, the second electrode, and the third electrode in a second direction crossing the first direction;
a second semiconductor region including a second nitride semiconductor and being provided between the second electrode and the first semiconductor region in the second direction;
a third semiconductor region including a third nitride semiconductor and being provided between the third electrode and the first semiconductor region in the second direction; and
an intermediate region including boron and nitrogen,
a second bandgap energy of the second semiconductor region being larger than a first bandgap energy of the first semiconductor region,
a third bandgap energy of the third semiconductor region being larger than the first bandgap energy, at least a portion of the first electrode being positioned between the second semiconductor region and the third semiconductor region in the first direction, the intermediate region including
- a first partial region positioned between the first electrode and the first semiconductor region in the second direction,
- a second partial region positioned between the second semiconductor region and the at least a portion of the first electrode in the first direction, and
- a third partial region positioned between the third semiconductor region and the at least a portion of the first electrode in the first direction, the first partial region includes a first compound region and a second compound region, the first compound region including a first compound, the first compound including $Al_{x4}Ga_{1-x4}N$ (x2≤x4≤1 and x3≤x4≤1), the second compound region being provided between the first electrode and the first compound region in the second direction, the second compound region including boron and nitrogen, the second partial region includes a third compound region and a fourth compound region, the third compound region including the first compound, the fourth compound region being provided between the second semiconductor region and the at least the portion of the first electrode in the first direction, the fourth compound region including boron and nitrogen, the third partial region includes a fifth compound region and a sixth compound region, the fifth compound region including the first compound, the sixth compound region being provided between the third semiconductor region and the at least the portion of the first electrode in the first direction, the sixth compound region including boron and nitrogen.

3. The device according to claim 1, wherein
of the third compound region contacts the second semiconductor region, and
the fifth compound region contacts the third semiconductor region.

4. The device according to claim 1, wherein
a thickness along the second direction of the first compound region is not less than 1 nanometer and not more than 100 nanometers, and
a thickness along the second direction of the second compound region between the first electrode and the first semiconductor region in the second direction is not less than 1 nanometer and not more than 100 nanometers.

5. The device according to claim 1, wherein a thickness along the second direction of the first partial region is not less than 1 nanometer and not more than 100 nanometers.

6. The device according to claim 1, wherein
the intermediate region further includes a fourth partial region and a fifth partial region,
at least a portion of the second semiconductor region is positioned between the fourth partial region and the first semiconductor region in the second direction, and
at least a portion of the third semiconductor region is positioned between the fifth partial region and the first semiconductor region in the second direction.

7. The device according to claim 1, wherein
the first semiconductor region includes a portion overlapping the first electrode in the second direction, and
the first partial region contacts the overlapping portion.

8. The device according to claim 1, wherein
the second partial region contacts the second semiconductor region, and
the third partial region contacts the third semiconductor region.

9. The device according to claim 1, wherein the first semiconductor region includes GaN.

10. The device according to claim 1, wherein a composition ratio of aluminum included in the first semiconductor region is less than 0.01.

11. The device according to claim 1, wherein a composition ratio of aluminum included in the second semiconductor region is not less than 0.01 and not more than 0.3.

12. The device according to claim 1, wherein a ratio of a difference between a composition ratio of aluminum included in the second semiconductor region and a composition ratio of aluminum included in the third semiconductor region to the composition ratio of aluminum included in the second semiconductor region is 0.1 or less.

13. The device according to claim 1, wherein
a thickness along the second direction of the second semiconductor region is not less than 5 nanometers and not more than 50 nanometers, and
a thickness along the second direction of the third semiconductor region is not less than 5 nanometers and not more than 50 nanometers.

14. The device according to claim 1, wherein
the first compound region contacts the first semiconductor region,
the third compound region contacts the second semiconductor region, and
the fifth compound region contacts the third semiconductor region.

15. The device according to claim 1, wherein
the second compound region contacts the first electrode,
the fourth compound region contacts the at least the portion of the first electrode, and
the sixth compound region contacts the at least the portion of the first electrode.

16. The device according to claim 2, wherein
the first compound region contacts the first semiconductor region,
the third compound region contacts the second semiconductor region, and
the fifth compound region contacts the third semiconductor region.

17. The device according to claim 2, wherein
the second compound region contacts the first electrode,
the fourth compound region contacts the at least the portion of the first electrode, and
the sixth compound region contacts the at least the portion of the first electrode.

* * * * *